(12) United States Patent
Koyanagi et al.

(10) Patent No.: US 9,235,185 B2
(45) Date of Patent: Jan. 12, 2016

(54) IMAGE FORMING APPARATUS INCLUDING A SHIELD CASE IN WHICH A CIRCUIT BOARD MOUNTED WITH AN ELECTRIC CIRCUIT IS CONTAINED

(71) Applicant: KYOCERA Document Solutions Inc., Osaka (JP)

(72) Inventors: Tsuyoshi Koyanagi, Osaka (JP); Naoki Yamane, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 14/465,286

(22) Filed: Aug. 21, 2014

(65) Prior Publication Data

US 2015/0063863 A1     Mar. 5, 2015

(30) Foreign Application Priority Data

Aug. 27, 2013  (JP) ................. 2013-175400

(51) Int. Cl.
*G03G 15/00* (2006.01)
*G03G 21/16* (2006.01)
*H05K 9/00* (2006.01)

(52) U.S. Cl.
CPC ............ *G03G 15/80* (2013.01); *G03G 21/1652* (2013.01); *H05K 9/0049* (2013.01)

(58) Field of Classification Search
CPC .............. G03G 15/80; G03G 21/1652; G03G 2221/166; H05K 9/0049; H05K 9/0037; H05K 5/0047; H05K 5/0052; H05K 5/0073; H05K 5/0239; H05K 5/04

USPC ....................... 399/90, 107; 361/752; 174/520
See application file for complete search history.

(56) References Cited

U.S. PATENT DOCUMENTS

| 4,672,510 | A | * | 6/1987 | Castner | .................. | 361/679.32 |
| 5,414,597 | A | * | 5/1995 | Lindland et al. | .............. | 361/816 |
| 6,788,542 | B2 | * | 9/2004 | Rumney | ........................ | 361/724 |
| 7,095,626 | B2 | * | 8/2006 | Seidler | ........................ | 361/816 |
| 2010/0079963 | A1 | * | 4/2010 | Tsubono | ....................... | 361/752 |
| 2013/0195499 | A1 | * | 8/2013 | Masaki | ........................... | 399/90 |
| 2013/0322021 | A1 | * | 12/2013 | Ohoka et al. | ................... | 361/714 |
| 2014/0079433 | A1 | * | 3/2014 | Watanabe | ..................... | 399/107 |

FOREIGN PATENT DOCUMENTS

| GB | 2297869 | A | * | 8/1996 |
| JP | 2000056052 | A | * | 2/2000 |
| JP | 2001-130091 | A |   | 5/2001 |
| JP | 2005276934 | A | * | 10/2005 |

* cited by examiner

*Primary Examiner* — Robert Beatty
(74) *Attorney, Agent, or Firm* — Studebaker & Brackett PC (57) ABSTRACT

An image forming apparatus includes a shield case in which a circuit board mounted with an electric circuit is contained. The shield case has an electrical conductive case main body and an electrical conductive lid member. The case main body has an aperture formed in a part of one face. The lid member has one end turnably supported by the case main body and the other end fastened to the case main body by a screw when the aperture is closed. The case main body and lid member have an engaged part and an engaging part engaged with each other when the aperture is closed. The engaging part is formed so as to clamp the engaged part. The shield case is configured so that contact force between the engaging part and engaged part is increased, if the screw is rotated in a fastening direction when the aperture is closed.

6 Claims, 8 Drawing Sheets

IMAGE FORMING APPARATUS INCLUDING A SHIELD CASE IN WHICH A CIRCUIT BOARD MOUNTED WITH AN ELECTRIC CIRCUIT IS CONTAINED

INCORPORATION BY REFERENCE

This application is based on and claims the benefit of priority from Japanese Patent application No. 2013-175400 filed on Aug. 27, 2013, the entire contents of which are incorporated herein by reference.

BACKGROUND

The present disclosure relates to an image forming apparatus including a shield case in which a circuit board mounted with an electric circuit is contained.

In an image forming apparatus, a control circuit board mounted with an electric circuit controlling various parameters with regard to image forming is contained in a shield case. The shield case is electrically connected, in general, to a main body frame at the back side of the image forming apparatus by screw fastening and grounded via the main body frame.

In a main body of the shield case, an aperture is bored, which is used for manipulating the control circuit board in a case of an inspection of the control circuit board, an extension of memory or other work. The aperture is configured to open/close by a lid member. If the lid member is not electrically connected to the main body of the shield case, an electromagnetic wave may be leaked from the shield case.

Therefore, in the shield case having the lid member fastened to the periphery of the aperture of the main body by a plurality of screws, protrusions may be formed between screw fastened parts in a back face of the lid member. When the lid member is fastened to the main body of the shield case by the screws, because the protrusions are pressed to the main body of the shield case by the lid member, the lid member and main body of the shield case are surely contacted and electrically conducted.

However, in the above-mentioned shield case, because the plurality of the screws must be used for fastening the lid member to the periphery of the aperture, there is a problem that labor and time are taken in opening/closing work of the lid member. Moreover, because a plurality of the protrusions are formed in the lid member, there is a problem that manufacturing cost of the lid member is increased.

SUMMARY

In accordance with an embodiment of the present disclosure, an image forming apparatus includes a shield case in which a circuit board mounted with an electric circuit is contained. The shield case has an electrical conductive case main body and an electrical conductive lid member. The case main body has an aperture formed in a part of one face. The lid member has one end turnably supported by the case main body and the other end fastened to the case main body by a screw when the aperture is closed. The case main body and lid member have an engaged part and an engaging part engaged with each other when the aperture is closed. The engaging part is formed so as to clamp the engaged part. The shield case is configured so that contact force between the engaging part and engaged part is increased, if the screw is rotated in a fastening direction when the aperture is closed.

The above and other objects, features, and advantages of the present disclosure will become more apparent from the following description when taken in conjunction with the accompanying drawings in which a preferred embodiment of the present disclosure is shown by way of illustrative example.

BRIEF DESCRIPTION OF THE DRAWINGS

FIGS. 8A and 8B are respectively a front view and a side view showing the color printer, in a condition where a protruded piece of the lid member is engaged with a cover piece of a case main body, according to the embodiment of the present disclosure.

DETAILED DESCRIPTION

In the following, with reference the drawings, an image forming apparatus according to an embodiment of the present disclosure will be described.

Figure 1:
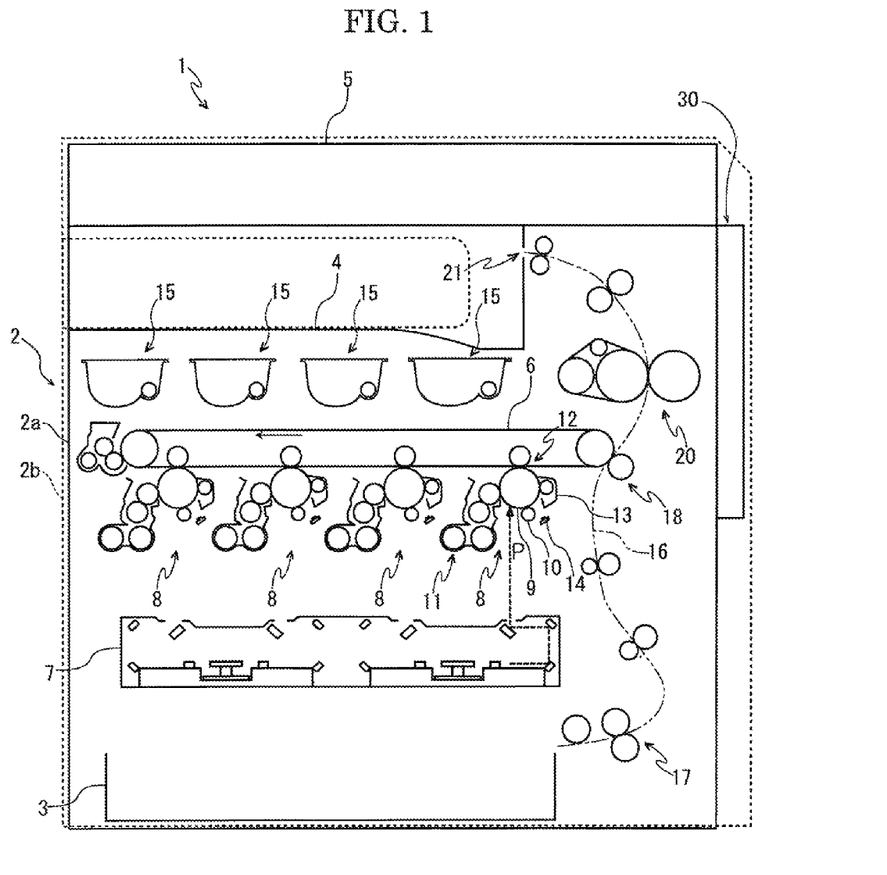
FIG. 1 is a schematic diagram schematically showing a structure of a color printer according to an embodiment of the present disclosure.

First, with reference to FIG. 1, the entire structure of a color printer 1 as an image forming apparatus will be described. FIG. 1 is a schematic diagram schematically showing the structure of the color printer according to the embodiment of the present disclosure. In the description with regard to FIG. 1, the left-hand side of FIG. 1 indicates the front side of the printer 1 and an orthogonal direction to forward and backward directions as viewed from the front side indicates left and right directions.

The color printer 1 includes a box-formed printer main body 2. The printer main body 2 has a main body frame 2a and a cover member 2b. The main body frame 2a is a sheet metal member constituting an outer shell of the printer main body 2. The cover member 2b covers the surface of the main body frame 2a.

In a lower part of the printer main body 2, a sheet feeding cartridge 3 storing sheets (recording media) is installed and, in an upper part of the printer main body 2, an ejected sheet tray 4 is provided. In an upper end of the printer main body 2, an image reading device 5 is arranged above the ejected sheet tray 4.

In a center part of the printer main body 2, an intermediate transferring belt 6 is arranged. Below the intermediate transferring belt 6, an exposure device 7 composed of a laser scanning unit (LSU) is installed. At a lower side of the intermediate transferring belt 6, four image forming parts 8 are installed for respective toner colors (for example, four colors of magenta, cyan, yellow and black). Since the above-mentioned four image forming parts 8 have the similar configuration, one of the four image forming parts 8 will be described. In the image forming part 8, a photosensitive drum 9 is rotatably attached. Around the photosensitive drum 9, a charger 10, a development device 11, a first transferring part 12, a cleaning device 13 and a static eliminator 14 are located in a process order of first transferring. Above the development device 11, a toner container 15 corresponding to the image forming part 8 is installed for each toner color (for example, one of four colors of magenta, cyan, yellow and black).

At one side (the right-hand side of the figure) in the printer main body 2, a conveying path 16 of the sheet is positioned so as to extend in upward and downward directions. At an upstream end of the conveying path 16, a sheet feeder 17 is positioned. At an intermediate stream part of the conveying path 16, a second transferring part 18 is positioned at one end (a right end of the figure) of the intermediate transferring belt 6. At a downstream part of the conveying path 16, a fixing device 20 is positioned. At a downstream end of the conveying path 16, an ejection port 21 is positioned.

To a back face of the main body frame 2a of the printer main body 2, a shield case 30 is attached. In the shield case 30, a circuit board, a connector, a fan and others are contained. Onto the circuit board, an electric circuit controlling various parameters with regard to image forming, a power supply circuit, memory and others are mounted.

Next, the operation of forming an image by the color printer 1 having such a configuration will be described. When the power is supplied to the color printer 1, various parameters are initialized in a control circuit and initial determination, such as temperature determination of the fixing device 20, is carried out. Subsequently, in the printer 1, when a document image is read by the image reading device 5, image forming operation is carried out as follows.

First, the surface of the photosensitive drum 9 is electric-charged by the charger 10. Then, on the surface of the photosensitive drum 9, an electrostatic latent image is formed by a laser light (refer to an arrow P in FIG. 1) from the exposure device 7. The electrostatic latent image is developed to a toner image having a correspondent color with the toner supplied from the toner container 15 in the development device 11. The toner image is first-transferred onto the surface of the intermediate transferring belt 6 in the first transferring part 12. The above-mentioned operation is repeated in order by the respective image forming parts 8, thereby forming the toner image having full color onto the intermediate transferring belt 6. Toner and electric charge remained on the photosensitive drum 9 are eliminated by the cleaning device 13 and static eliminator 14.

On the other hand, the sheet fed from the sheet feeding cartridge 3 or a manual bypass tray (not shown) by the sheet feeder 17 is conveyed to the second transferring part 18 in a suitable timing for the above-mentioned image forming operation. Then, in the second transferring part 18, the toner image having full color on the intermediate transferring belt 6 is second-transferred onto the sheet. The sheet with the second-transferred toner image is conveyed to a downstream side on the conveying path 16 to enter the fixing device 20, and then, the toner image is fixed on the sheet in the fixing device 20. The sheet with the fixed toner image is ejected from the ejection port 21 onto the ejected sheet tray 4.

Figure 2:
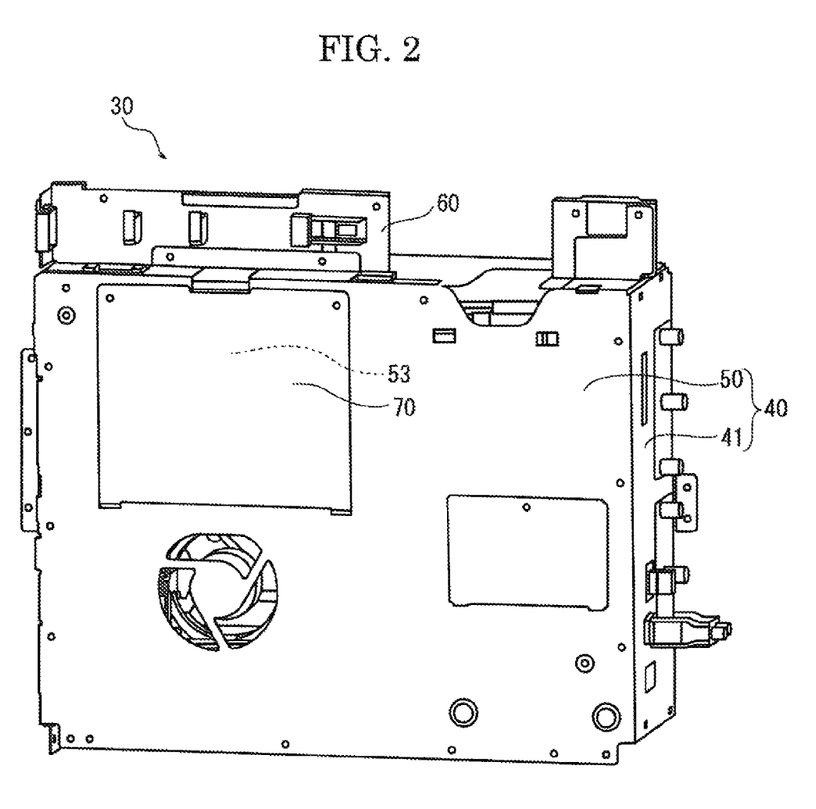
FIG. 2 is a perspective view showing a shield case in the color printer according to the embodiment of the present disclosure.
Figure 3:
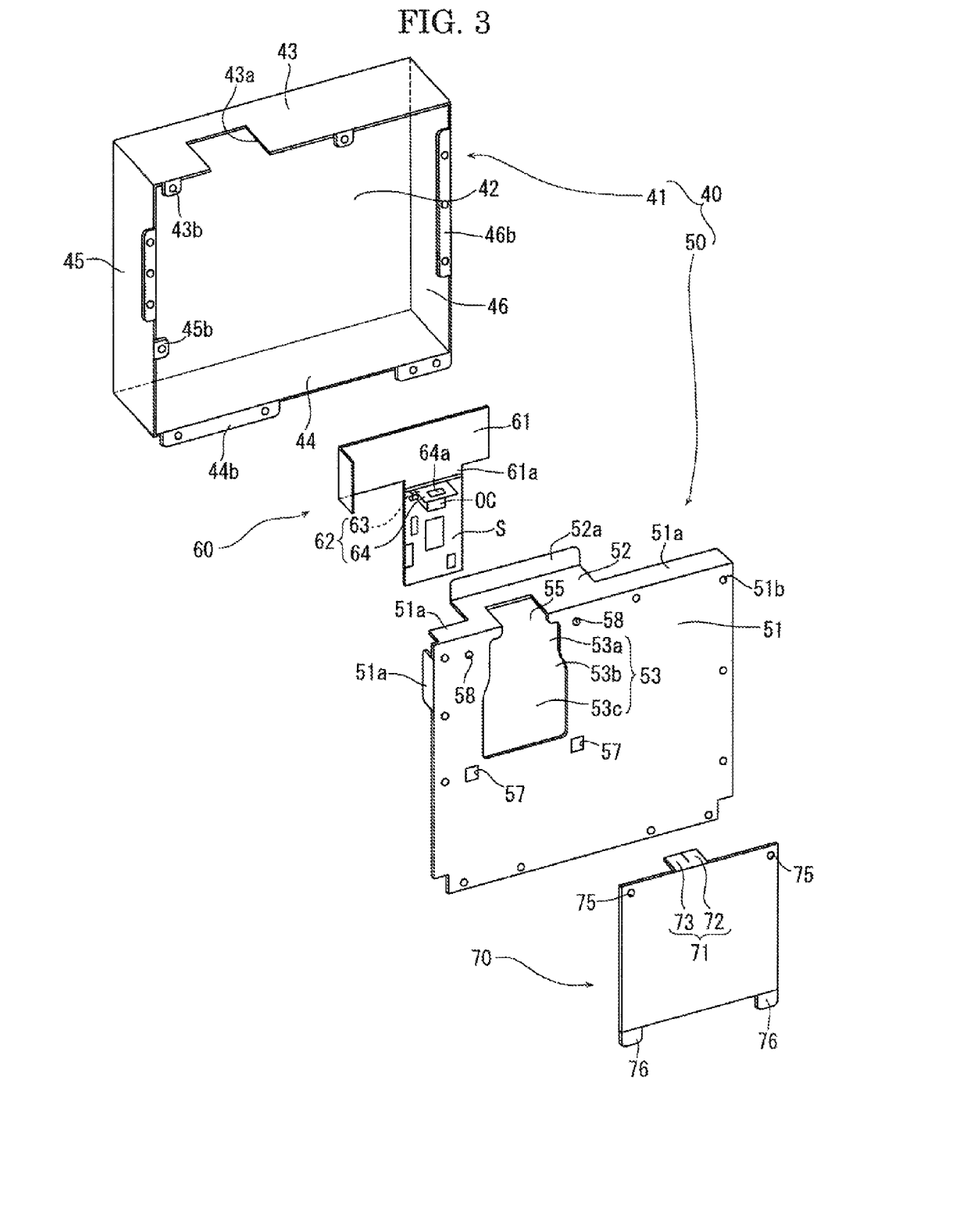
FIG. 3 is an exploded perspective view showing the shield case in the color printer according to the embodiment of the present disclosure.
Figure 4:
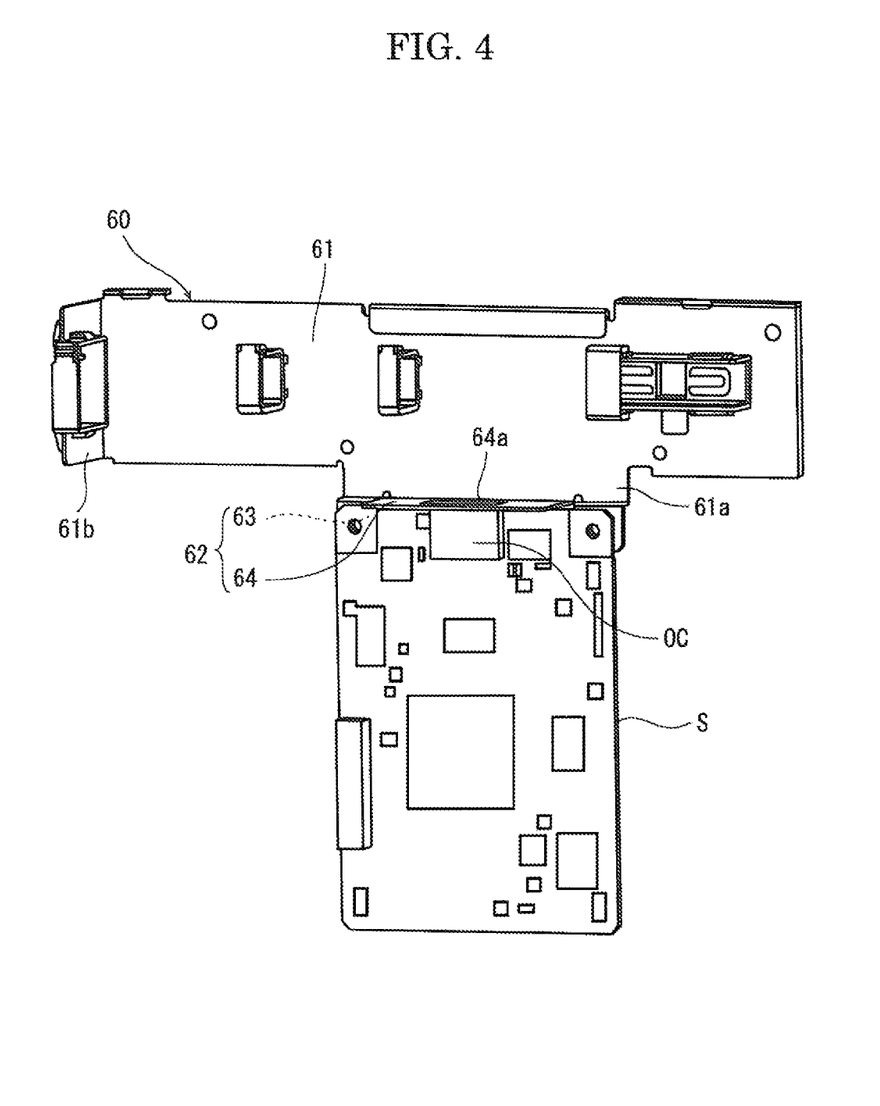
FIG. 4 is a perspective view showing a circuit board contained in the shield case of the color printer according to the embodiment of the present disclosure.
Figure 5:
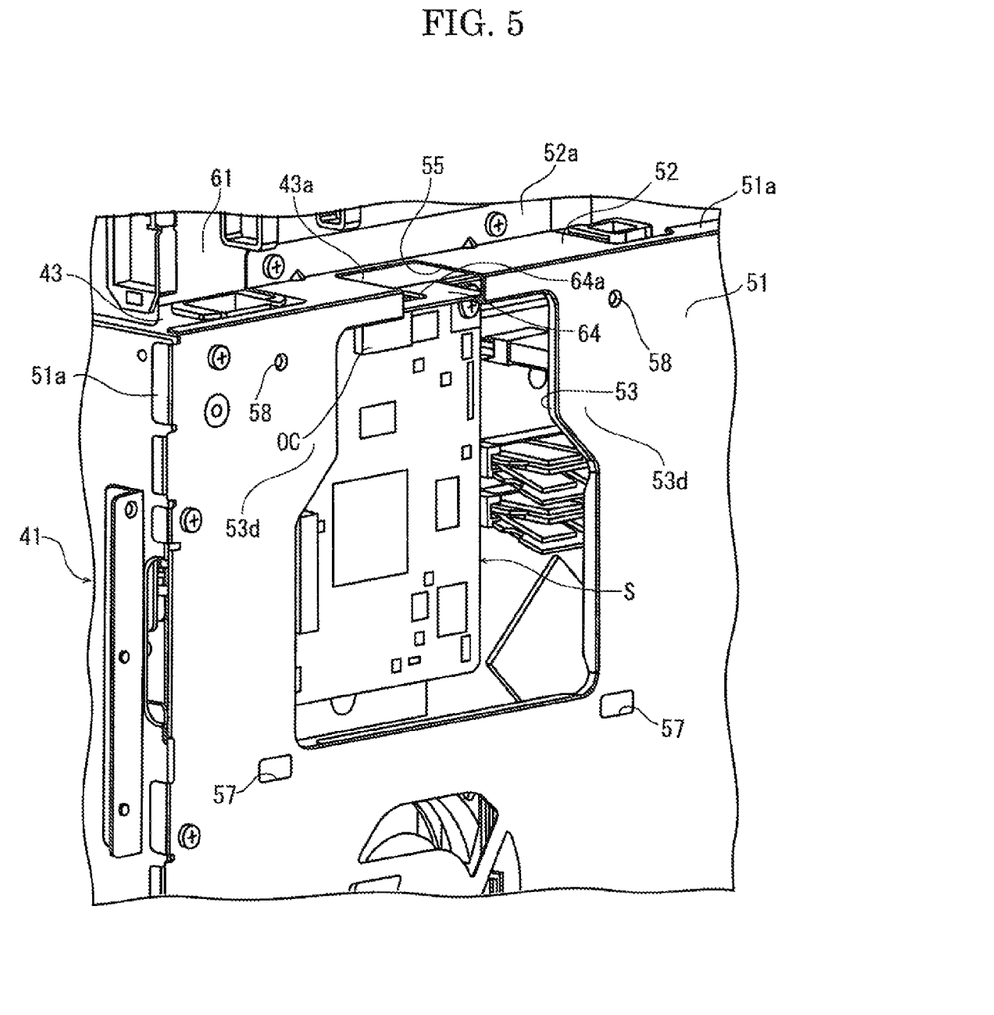
FIG. 5 is a perspective view showing the shield case, in a condition where the circuit board is contained, in the color printer according to the embodiment of the present disclosure.
Figure 6:
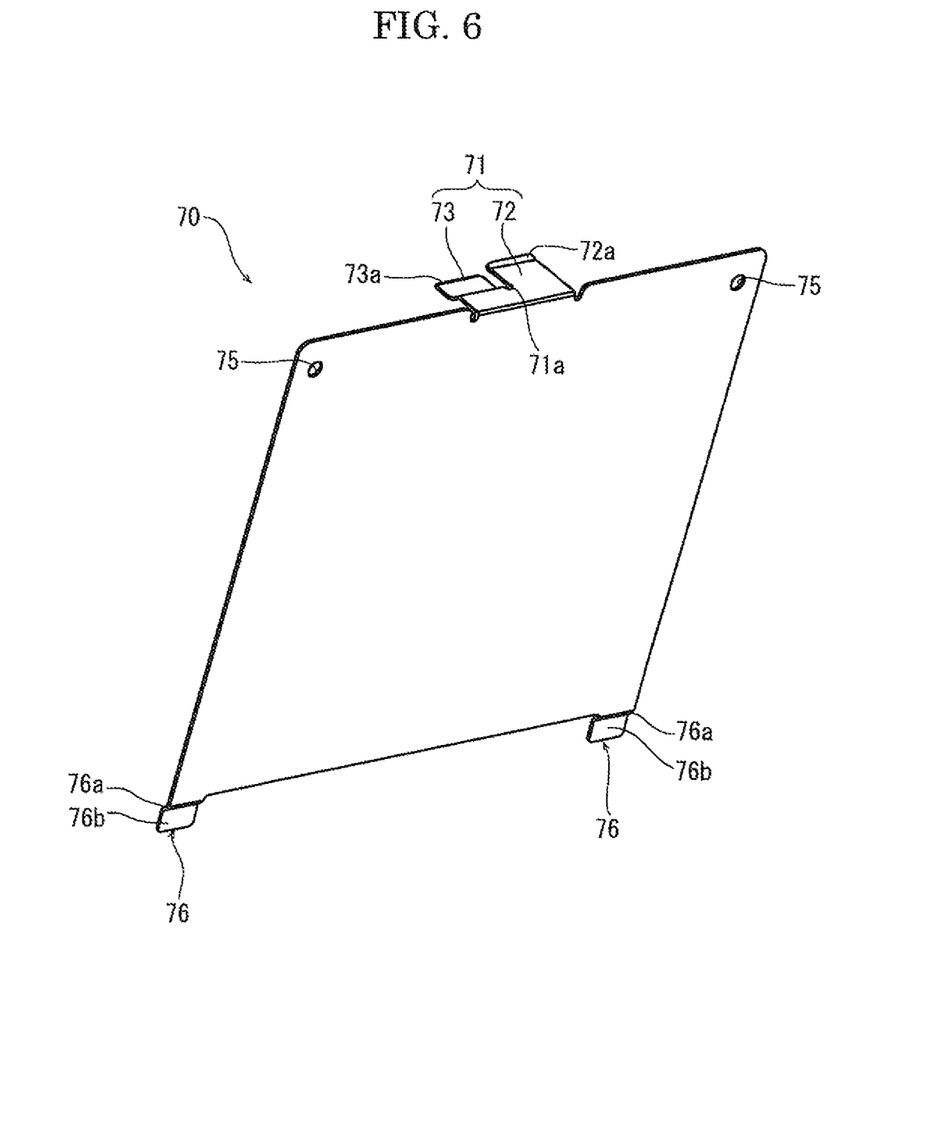
FIG. 6 is a perspective view showing a lid member of the shield case in the color printer according to the embodiment of the present disclosure.

Next, with reference to FIGS. 2-6, the shield case will be described. FIG. 2 is a perspective view showing the shield case. FIG. 3 is an exploded perspective view showing simplified components of the shield case. FIG. 4 is a perspective view showing the circuit board. FIG. 5 is a perspective view showing the shield case, in a condition where the circuit board is attached to a case main body. FIG. 6 is a perspective view showing a lid member. Since the shield case is attached to a back side of the color printer as mentioned above, the shield case as viewed from the back side of the color printer will be described in the following. In the following description, left and right directions and forward and backward directions correspond the respective directions as viewed from the back side of the printer.

The shield case 30, as shown in FIG. 2, includes the case main body 40 and lid member 70. The case main body 40 contains the circuit board, fan, connector and others. In a part of a front face (one face) of the case main body 40, an aperture 53 for manipulation of the circuit board is formed. The lid member 70 is configured so as to open/close the aperture 53 of the case main body 40.

The case main body 40 is a box like member formed in a flat rectangular parallelepiped shape being thin in the forward and backward directions. The case main body 40 has a box body 41 with an opening at the front side and a top plate 50 covering the opening at the front side of the box body 41, and is made of a sheet metal member with electrical conductivity. The case main body 40 is attached to the main body frame 2a of the color printer 1 by screw fastening or the like and grounded via the main body frame 2a.

The box body 41 has, as shown in FIG. 3, a basal plate 42 in a slightly lateral rectangular shape, upper and lower side plates 43 and 44 respectively erected from upper and lower sides of the basal plate 42, and left and right side plates 45 and 46 respectively erected from left and right sides of the basal plate 42. Onto a front face of the basal plate 42, the circuit board, the fan cooling the circuit board, a plurality of the connectors and others are arranged. The circuit board is located at a slightly left position in an upper portion of the basal plate 42 and the fan is located below the circuit board. Various connectors, a holder bundling signal cables and power supply lines and others are located at both sides of the circuit board.

In the upper side plate 43, at a position corresponding to the circuit board, a notch 43a is formed. The notch 43a has a rectangular shape to extend from a front edge to the vicinity of a back edge of the upper side plate 43.

Along circumference edges of the upper and lower side plates 43 and 44 and the left and right side plates 45 and 46, a plurality of tongue like pieces 43b, 44b, 45b and 46b are formed protruding inwardly or outwardly roughly at right angles to the upper and lower side plates 43 and 44 and the left and right side plates 45 and 46. In the tongue like pieces 43b, 44b, 45b and 46b, screw holes are bored.

The top plate 50 has a front plate 51 in a slightly lateral rectangular shape similarly to the basal plate 42 of the box body 41 and an upper plate 52 bent backwardly from roughly left half of upper side of the front plate 51 at right angles. The front plate 51 is formed with outer edge parts 51a bent backwardly roughly at right angles from the upper side and continuing from both sides of the upper plate 52. The front plate 51 is further formed with a plurality of outer edge parts 51a bent backwardly roughly at right angles from the left and right sides. Along the circumference of the front plate 51, a plurality of the penetrating holes 51b are bored. The upper plate 52 is formed with a back edge part 52a bent upwardly at right angles from the back side.

In the front plate 51, an aperture 53 is formed at a position corresponding to the circuit board arranged on the basal plate 42 of the box body 41. The aperture 53 (hereinafter, called as a circuit board aperture) is formed in a roughly longitudinal rectangular shape. The circuit board aperture 53 has an upper rectangular profiled part 53a with a narrow width, a trapezoid profiled part 53b with a width gradually widened in the downward direction from the upper rectangular profiled part 53a and a lower rectangular profiled part 53c with a wide width extending downwardly from the trapezoid profiled part 53b. Via the circuit board aperture 53, almost of the entire of the circuit board is exposed.

Around the periphery of the circuit board aperture 53 in the front plate 51, rectangular apertures 57 and screw holes 58 are formed. The rectangular apertures 57 are formed at a left lower side of a left lower corner and at a right lower side of a right lower corner of the circuit board aperture 53. The screw holes 58 are formed at a left side of a left upper corner and a right side of a right upper corner of the circuit board aperture 53.

At a corner between the front plate 51 and upper plate 52, a notch like aperture 55 is formed. A lower end of the notch like aperture 55 communicates with the upper rectangular profiled part 53a of the circuit board aperture 53.

Next, the circuit board S will be described with reference to FIG. 4. The circuit board S is formed in a longitudinal rectangular shape and mounted with electronic components, such as a central processing unit (CPU), a resistor and a capacitor; a connector; a holder bundling and fixing cables; and others.

The circuit board S is supported by a circuit board supporting member 60. The circuit board supporting member 60 includes a supporting plate 61 and a cover plate 63 (engaged part) and is made of a sheet metal member. The supporting plate 61 is formed in a lateral rectangular shape. Near the center of a lower edge of the supporting plate 61, an extending part 61a with a wide width extending downwardly is formed. A left end part 61b of the supporting plate 61 is bent forwardly roughly at right angles. Onto a front face of the supporting plate 61, a plurality of holder members bundling signal cables and power supply lines connecting to each component in the printer main body; connectors; and others are attached.

The cover plate 62 is a member formed in an L-shape as a side viewed profile to have a fixing piece 63 and a cover piece 64 (plate piece) extending forwardly from an upper end of the fixing piece 63 roughly at right angles. In the center of the cover piece 64, a small aperture 64a in a lateral rectangular shape is bored. The cover plate 62 is supported to the supporting plate 61 such that the fixing piece 63 is fixed to a lower part of the extending part 61a and the cover piece 64 projects forwardly from the extending part 61a roughly at right angles.

The circuit board S is fixed to the fixing piece 63 of the cover plate 62 with the upper end portion. The circuit board S is arranged so that an optional equipment connector OC mounted onto the circuit board S is positioned below the small aperture 64a of the cover piece 64 of the cover plate 62. The optional equipment is, for example, equipment, such as an automatic document reading device, added optionally to the color printer 1. A connector connected to terminals of a signal cable and a power supply line connecting to the optional equipment is configured to connect to the optional equipment connector OC via the small aperture 64a of the cover piece 64.

The optional equipment may be a storing medium storing a program and data of optionally added functions. A connector formed together with the storing medium in a body is connected to the optional equipment connector OC, and then, the storing medium is installed to the circuit board S. The small aperture 64a of the cover piece 64 has an aperture area narrower than an aperture area of the notch like aperture 55 of the box body 41 and is provided to have a degree of allowing the connector of the storing medium connected to the optional equipment connector OC to pass through.

Next, a condition where the circuit board supporting member 60 supporting the above-mentioned circuit board S is attached to the case main body 40 will be described with reference to FIGS. 3 and 5. In the circuit board supporting member 60, the extending part 61a of the supporting plate 61 is fitted in the notch 43a of the upper side plate 43 of the box body 41 and a back face of the extending part 61a comes into contact with a depth side end of the notch 43a. The supporting plate 61 is placed on the upper side plate 43 at both sides of the notch 43a and the circuit board S supported by the extending part 61a is supported by the upper side plate 43 in a posture floating from the basal plate 42 of the box body 41. The cover piece 64 of the cover plate 62 of the circuit board supporting member 60 is positioned below the notch 43a of the upper side plate 43 with a predetermined distance.

The top plate 50 covers the front side opening of the box body 41 by surrounding an outer circumference of the box body 41 with the upper plate 52 and the outer edge parts 51a. Subsequently, screws are inserted into the penetrating holes 51b formed in the circumference of the front plate 51 and screwed with the screw holes of the tongue like pieces 43b, 44b, 45b and 46b formed in the upper and lower side plates 43 and 44 and the left and right side plates 45 and 46 of the box body 41. Thereby, the top plate 50 is fixed to the box body 41.

At this time, the supporting plate 61 of the circuit board supporting member 60 is clamped between the notch 43a of the upper side plate 43 of the box body 41 and the back edge part 52a of the upper plate 52 of the top plate 50. Subsequently, by screw fastening of the supporting plate 61 and back edge part 52a, the circuit board supporting member 60 is supported by the case main body 40.

By such a configuration, as shown in FIG. 5, the circuit board S is exposed from the circuit board aperture 53 of the front plate 51, and then, the cover piece 64 of the cover plate 62 of the circuit board supporting member 60 is exposed from the notch like aperture 55. The optional equipment connector OC mounted onto the circuit board S is connectable passing through the notch like aperture 55 of the upper plate 52 of the top plate 50, the notch 43a of the upper side plate 43 of the box body 41 and the small aperture 64a of the cover plate 62 of the circuit board supporting member 60. That is, in the embodiment, the optional equipment connector OC is always connectable regardless of opening/closing of the circuit board aperture 53. The periphery of the optional equipment connector OC is covered by the cover piece 64 of the cover plate 62.

Since the notch 43a and notch like aperture 55 have the aperture areas wider than the small aperture 64a of the cover piece 64, it is possible to easily carry out connecting work of the connector of the optional equipment even if the circuit board aperture 53 is in a closing state. Since the small aperture 64a has the narrow aperture area of a degree of allowing the connector to pass through, the storing medium or the like is not dropped into the case main body 40 in error. Since the connector and storing medium of the optional equipment is located inside the notch like aperture 55 and is not projected from the upper plate 52, there is no interference in other works.

Next, the lid member 70 will be described with reference to FIG. 6. The lid member 70 is a rectangular flat plate larger than the circuit board aperture 53 of the top plate 50 of the case main body 40 and is made of a sheet metal member with electrical conductivity.

In the center of an upper edge (the other end) of the lid member 70, a protruded piece 71 (engaging part) extending backwardly roughly at right angles is formed. At the center in a width direction of the protruded piece 71, a slit 71a extending from the back edge roughly to the center in a longitudinal direction is formed. A right piece 72 (clamping piece) at the right side of the slit 71a extends straightly backwardly at right angles. A left piece 73 (clamping piece) at the left side of the slit 71a is bent partly downwardly, and then, extends backwardly in parallel to the right piece 72. Thus, between the right piece 72 and left piece 73, there is a certain degree of a gap in the upward and downward directions. A distance of the gap is slightly smaller than a plate thickness of the cover piece 64 of the circuit board supporting member 60.

A leading end part 72a of the right piece 72 is bent in the obliquely upward direction. A leading end part 73a of the left piece 73 is bent in the obliquely downward direction. By applying such formation, the distance of the gap between the right piece 72 and left piece 73 is gradually widened toward a leading end of the protruded piece 71.

In a left upper corner and a right upper corner of the lid member 70, respective penetrating holes 75 are bored, through which screws are inserted. In left and right ends of a lower edge (one end) of the lid member 70, respective hook parts 76 extending downwardly are formed. Each hook part 76 is formed in a lateral rectangular shape (plate-like shape) and has a step part 76a bent backwardly from the lower edge of the lid member 70 and a flat plate part 76b extending from the step part 76a in parallel to a plane of the lid member 70.

The lid member 70 is turnably supported by the top plate 50. When each hook part 76 of the lid member 70 is inserted into the rectangular aperture 57 (refer to FIG. 3) formed in the front plate 51 of the top plate 50, the step part 76a of each hook part 76 is placed on the lower edge of the rectangular aperture 57 and the lid member 70 becomes turnable around the step part 76a of each hook part 76.

Figure 7:
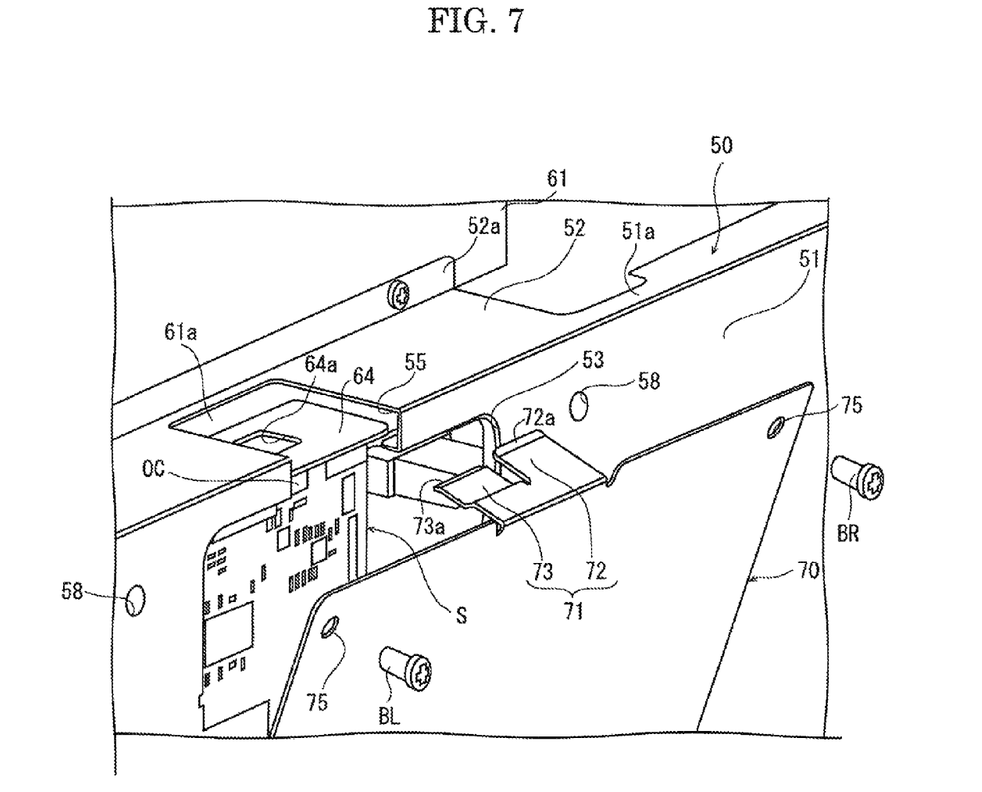
FIG. 7 is a perspective view showing the color printer, in a condition where the lid member is turned to a position roughly closing a circuit board aperture, according to the embodiment of the present disclosure.

A way of closing the circuit board aperture 53 of the case main body 40 by the lid member 70 in the shield case 30 having the above-mentioned configuration will be described with reference to FIGS. 7 and 8. FIG. 7 is a perspective view showing the protruded piece of the lid member and case main body when the lid member is turned roughly to a closing position. FIGS. 8A and 8B are respectively a front view and a side view showing the top plate and lid member, in a condition where the protruded piece of the lid member is engaged with the cover plate of the case main body.

As shown in FIG. 7, when the lid member 70 is turned in front of a full closing position of the circuit board aperture 53, the protruded piece 71 of the lid member 70 passes through the notch like aperture 55 formed in the top plate 50 and faces to the cover piece 64 of the cover plate 62 of the circuit board supporting member 60. When the lid member 70 is further turned, a front end of the cover piece 64 is inserted between the leading end part 72a of the right piece 72 and leading end part 73a of the left piece 73 in the protruded piece 71.

When the lid member 70 is furthermore turned, as shown in FIG. 8B, in the cover plate 62, a front portion from the small aperture 64a of the cover piece 64 is clamped between the right piece 72 and left piece 73 of the protruded piece 71 so that an upper face of the cover piece 64 contacts with a lower face of the right piece 72 and a lower face of the cover piece 64 contacts with an upper face of the left piece 73. At this time, the right piece 72 and left piece 73 respectively presses the upper face and lower face of the cover piece 64 by their own elasticity.

Moreover, when the lid member 70 is turned to the full closing position of the circuit board aperture 53, the circumference area of a back face of the lid member 70 contacts with the periphery area of the circuit board aperture 53 in the top plate 50. In addition, a front face of the flat plate part 76b of each hook part 76 contacts with a back face of the top plate 50.

Subsequently, as shown in FIG. 7, screws BL and BR are respectively inserted into the right and left penetrating holes 75 in the lid member 70 and screwed with the screw holes 58 of the top plate 50, thereby fastening the lid member 70 to the top plate 50 by the screws BL and BR. When the screws BL and BR are fastened, the screws BL and BR are rotated in a clockwise direction as indicated by arrows X in FIG. 8A.

Figure 8A:
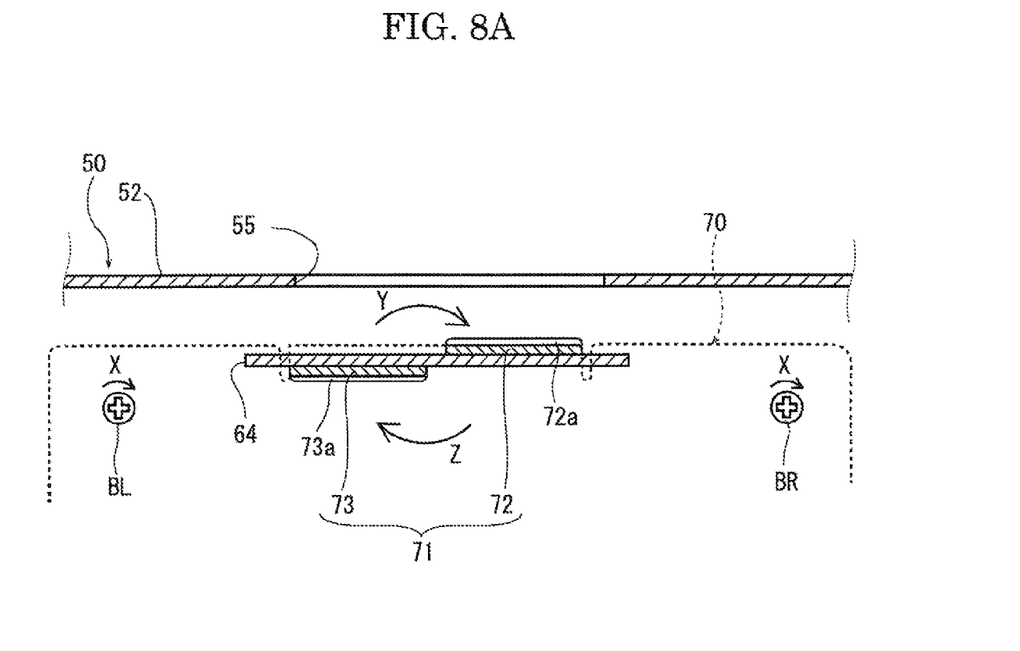

When the screws BL and BR are rotated in a clockwise direction indicated by arrows X in FIG. 8A, force toward a downstream side in a rotating direction is applied to the lid member 70. The force toward the downstream side in the rotating direction of the left and right screws BL and BR is also applied to the protruded piece 71 formed between left and right screw fastened parts of the lid member 70. By the rotation of the left screw BL, the force in the downward direction indicated by an arrow Y in FIG. 8A is applied to the protruded piece 71, and accordingly, the right piece 72 is pressed toward the cover piece 64. By the rotation of the right screw BR, the force in the upward direction indicated by an arrow Z in FIG. 8A is applied to the protruded piece 71, and accordingly, the left piece 73 is pressed toward the cover piece 64. Therefore, contact force of the right piece 72 and left piece 73 with the cover piece 64 is increased.

In accordance with the above-described color printer 1 according to the embodiment of the disclosure, it is possible to close the circuit board aperture 53 formed in the shield case 30 by simple manners of turning the lid member 70 to the closing position, clamping the cover piece 64 of the case main body 40 between the left piece 73 and right piece 72 of the protruded piece 71 of the lid member 70, and screwing the lid member 70 to the case main body 40 at two positions. By such screw fastening, since contact force between the protruded piece 71 of the lid member 70 and the cover piece 64 of the case main body 40 is increased, it is possible to securely electrically connect the lid member 70 and the case main body 40. At this time, not only the contact force between the protruded piece 71 and cover piece 64, but also contact force of the lid member 70 with the periphery 53d of the circuit board aperture 53 in the top plate 50 is increased. Therefore, it is possible to easily open and close the circuit board aperture 53 of the case main body 40 without taking labor and time for screwing the lid member to the periphery of the aperture. Furthermore, it is possible to obtain electrical connection between the case main body 40 and lid member 70 and to securely shield a leak of an electromagnetic wave out of the circuit board aperture 53. Since the small aperture 64a of the cover piece 64 has the narrow aperture area of a degree of allowing the connector connected to the optional equipment connector OC in the circuit board S to pass through, there is no possibility of leaking the electromagnetic wave.

The cover piece 64 as an engaged part at the case main body 40's side is formed together with the circuit board supporting member 60 in a body. Therefore, it is unnecessary to form new portion or to attach a separate component as the engaged part.

The protruded piece 71 as an engaging part at the lid member 70's side may be formed together with the lid member 70 in a body, for example, may be formed by a simple process, such as bending process.

In the embodiment, a case where the notch 43a is formed in the upper side plate 43 of the case main body 40 and the circuit board supporting member 60 supporting the circuit board S is supported by the notch 43a was described, in another embodiment, another way of supporting the circuit board supporting member 60 to the case main body 40 except for the upper side plate 43 may be applied.

In the embodiment, the plate piece like cover piece 64 is formed as the engaged part at the case main body 40's side and the clamping piece like protruded piece 71 is formed as the engaging part at the lid member 70's side. However, in another embodiment, a plate piece like engaged part may be formed at the lid member 70's side and a clamping piece like engaging part may be formed at the case main body 40's side.

The embodiment was described in a case of applying the configuration of the present disclosure to the printer 1. On the other hand, in another embodiment, the configuration of the disclosure may be applied to another image forming apparatus, such as a copying machine, a facsimile or a multifunction peripheral, except for the printer 1.

While the present disclosure has been described with reference to the particular illustrative embodiments, it is not to be restricted by the embodiments. It is to be appreciated that those skilled in the art can change or modify the embodiments without departing from the scope and spirit of the present disclosure.

What is claimed is:

1. An image forming apparatus comprising: a shield case in which a circuit board mounted with an electric circuit is contained,
   wherein the shield case includes:
   an electrical conductive case main body having an aperture formed in a part of one face and
   an electrical conductive lid member having one end turnably supported by the case main body and the other end fastened to the case main body by a screw when the aperture is closed,
   the case main body and lid member have an engaged part and an engaging part engaged with each other when the aperture is closed, wherein the engaging part is formed so as to clamp the engaged part,
   the shield case is configured so that contact force between the engaging part and engaged part is increased, if the screw is rotated in a fastening direction when the aperture is closed,
   wherein one of the engaged part and engaging part has a plate piece and the other of the engaged part and engaging part has a clamping piece clamping the plate piece, and
   the plate piece is a supporting member supporting the circuit board to the case main body.

2. The image forming apparatus according to claim 1, wherein the engaged part and engaging part are formed at sides on which the lid member and case main body are fastened with the screw.

3. The image forming apparatus according to claim 1, wherein
   the case main body has a notch like aperture formed in an adjacent face to the one face having the aperture; the notch like aperture communicating with the aperture via a corner,
   the plate piece is arranged in the case main body so as to face to the notch like aperture with a predetermined distance and has a small aperture with a narrower aperture area than the notch like aperture,
   the circuit board includes a connector arranged inside the small aperture of the plate piece,
   the connector is connectable passing through the notch like aperture and small aperture when the aperture is closed.

4. The image forming apparatus according to claim 1, wherein
   the clamping piece has at least two pieces alternately arranged along an edge of the lid member.

5. An image forming apparatus comprising: a shield case in which a circuit board mounted with an electric circuit is contained,
   wherein the shield case includes:
   an electrical conductive case main body having an aperture formed in a part of one face and
   an electrical conductive lid member having one end turnably supported by the case main body and the other end fastened to the case main body by a screw when the aperture is closed,
   the case main body and lid member have an engaged part and an engaging part engaged with each other when the aperture is closed, wherein the engaging part is formed so as to clamp the engaged part,
   the shield case is configured so that contact force between the engaging part and engaged part is increased, if the screw is rotated in a fastening direction when the aperture is closed,
   the lid member is turnably supported to the case main body by a plate piece like hook part formed in the one end, and
   the hook part is configured so as to come into surface contact with the case main body.

6. An image forming apparatus comprising: a shield case in which a circuit board mounted with an electric circuit is contained,
   wherein the shield case includes:
   an electrical conductive case main body having an aperture formed in a part of one face and
   an electrical conductive lid member having one end turnably supported by the case main body and the other end fastened to the case main body by a screw when the aperture is closed,
   the case main body and lid member have an engaged part and an engaging part engaged with each other when the aperture is closed, wherein the engaging part is formed so as to clamp the engaged part,
   the shield case is configured so that contact force between the engaging part and engaged part is increased, if the screw is rotated in a fastening direction when the aperture is closed, and
   the case main body is formed so that a contact area with the lid member in the periphery of the aperture is widened at a side on which the lid member is fastened with the screw.

\* \* \* \* \*